(12) United States Patent
Chen et al.

(10) Patent No.: US 8,634,253 B2
(45) Date of Patent: Jan. 21, 2014

(54) DETERMINING MEMORY PAGE STATUS

(75) Inventors: Frank Chen, Shanghai (CN); Zhao Wei, Shanghai (CN); Yuan Rong, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/618,213

(22) Filed: Sep. 14, 2012

(65) Prior Publication Data

US 2013/0013817 A1 Jan. 10, 2013

Related U.S. Application Data

(62) Division of application No. 13/154,901, filed on Jun. 7, 2011, now Pat. No. 8,279,682, which is a division of application No. 12/355,934, filed on Jan. 19, 2009, now Pat. No. 7,969,782.

(30) Foreign Application Priority Data

Sep. 26, 2008 (CN) .......................... 2008 1 0211465
Sep. 30, 2008 (TW) .............................. 97137518 A

(51) Int. Cl.
*G11C 16/04* (2006.01)
(52) U.S. Cl.
USPC ............. 365/185.28; 365/185.12; 365/185.21

(58) Field of Classification Search
USPC ........................... 365/185.12, 185.21, 185.28
See application file for complete search history.

(56) References Cited

U.S. PATENT DOCUMENTS

| | | | |
|---|---|---|---|
| 6,259,630 B1 | 7/2001 | Kawamura | |
| 6,972,993 B2 | 12/2005 | Conley et al. | |
| 2004/0264262 A1* | 12/2004 | Ishimoto et al. | 365/195 |
| 2008/0002468 A1 | 1/2008 | Hemink | |
| 2008/0072119 A1* | 3/2008 | Rozman | 714/763 |
| 2008/0126712 A1 | 5/2008 | Mizushima | |
| 2009/0300311 A1 | 12/2009 | Lee | |
| 2009/0303789 A1 | 12/2009 | Fernandes | |

OTHER PUBLICATIONS

Taiwan Office Action for related Taiwan Application No. 097137518, mailed Mar. 25, 2013, (4 pgs.).

* cited by examiner

*Primary Examiner* — Hoai V Ho
(74) *Attorney, Agent, or Firm* — Brooks, Cameron & Huebsch, PLLC

(57) ABSTRACT

The present disclosure includes methods, devices, modules, and systems for operating semiconductor memory. One method embodiment includes determining a status of a page of memory cells without using input/output (I/O) circuitry, and outputting the status through the I/O circuitry.

16 Claims, 8 Drawing Sheets

DETERMINING MEMORY PAGE STATUS

PRIORITY INFORMATION

This application is a Divisional of U.S. application Ser. No. 13/154,901, filed Jun. 7, 2011, and issued as U.S. Pat. No. 8,279,682 on Oct. 2, 2012, which is a Divisional of U.S. application Ser. No. 12/355,934, filed Jan. 19, 2009 and issued as U.S. Pat. No. 7,969,782 on Jun. 28, 2011, which claims priority to a China Patent Application Serial No. 200810211465.6, filed Sep. 26, 2008, and a Taiwan Patent Application Serial No. 097137518, filed Sep. 30, 2008, the specifications of which are incorporated by reference herein.

TECHNICAL FIELD

The present disclosure relates generally to semiconductor memory devices, methods, and systems, and more particularly, to operating semiconductor memory.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory, among others.

Flash memory devices may be utilized as volatile and non-volatile memory for a wide range of electronic applications. Flash memory devices typically use a one-transistor memory cell that allows for high memory densities, high reliability, and low power consumption.

Uses for flash memory include memory for sold state drives (SSDs), personal computers, personal digital assistants (PDAs), digital cameras, cellular telephones, portable music players, e.g., MP3 players, and movie players. Program code and system data, such as a basic input/output system (BIOS), are typically stored in flash memory devices. This information may be used in personal computer systems, among others. Some uses of flash memory may include multiple reads of data programmed to a flash memory device without erasing the data.

Two common types of flash memory array architectures are the "NAND" and "NOR" architectures, so called for the logical form in which the basic memory cell configuration of each is arranged. A NAND array architecture arranges its array of floating gate memory cells in a matrix such that the gates of each floating gate memory cell in a "row" of the array are coupled to an access line, which is commonly referred to in the art as a "word line". However each memory cell is not directly coupled to a data line (which is commonly referred to as a digit line, e.g., a bit line, in the art) by its drain. Instead, the memory cells of the array are coupled together in series, source to drain, between a source line and a sense line, where the memory cells commonly coupled to a particular sense line are referred to as a "column".

Memory cells in a NAND array architecture may be programmed to a desired state. That is, electric charge can be placed on or removed from the floating gate of a memory cell to put the cell into a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multi-digit cells, or multilevel cells (MLCs). MLCs may allow the manufacture of higher density memories without increasing the number of memory cells since each cell can represent more than one digit, e.g., more than one bit. MLCs may have more than two programmed states, e.g., a cell capable of representing four digits can have sixteen programmed states. For some MLCs, one of the sixteen programmed states may be an erased state. For these MLCs, the lowermost program state is not programmed above the erased state, that is, if the cell is programmed to the lowermost state, it remains in the erased state rather than having a charge applied to the cell during a programming operation. The other fifteen programmed states may be referred to as "non-erased" states.

A page of memory cells may have a status, e.g., erased and/or non-erased, associated therewith. The status of a page of memory cells may be based on, e.g., depend on, the state of the memory cells in the page. One operation to determine the status of a page of memory cells may include outputting a sensed state(s) of the memory cells in the page from a register coupled to the page to input/output (I/O) circuitry.

DETAILED DESCRIPTION

Figure 1:
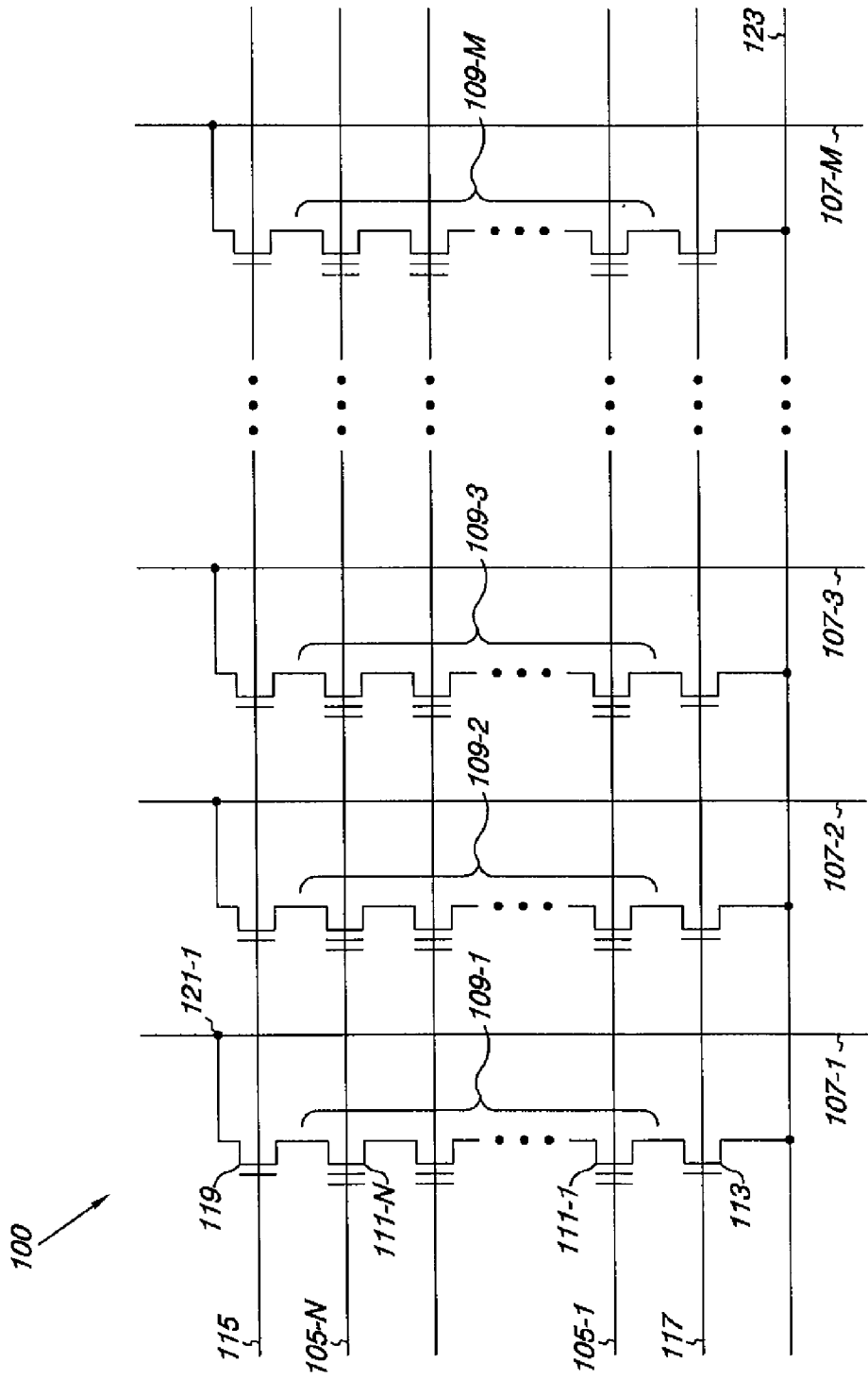
FIG. 1 is a schematic of a portion of a non-volatile memory array in accordance with one or more embodiments of the present disclosure.

The present disclosure includes methods, devices, modules, and systems for operating semiconductor memory. One method embodiment includes determining a status of a page of memory cells without using input/output (I/O) circuitry, and outputting the status through the I/O circuitry.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a schematic of a portion of a non-volatile memory array 100 in accordance with one or more embodiments of the present disclosure. The embodiment of FIG. 1 illustrates a NAND architecture non-volatile memory. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each associated with an intersection of a word line 105-1, . . . , 105-N and a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of non-volatile memory cells, 111-1, . . . , 111-N, includes a source, a drain, a floating gate or other charge storage node, and a control gate. Non-volatile memory cells, 111-1, . . . , 111-N, have their control gates coupled to a word line, 105-1, . . . , 105-N respectively. A "column" of the non-volatile memory cells, 111-1, . . . , 111-N, make up the NAND strings, e.g., 109-1, 109-2, 109-3, . . . , 109-M, and are coupled to a given local bit line, e.g., 107-1, 107-2, 107-3, . . . , 107-M respectively. A "row" of the non-volatile memory cells are those memory cells commonly coupled to a given word line, e.g., 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells to a desired program voltage level corresponding to a desired program state.

A sensing operation, such as a read or program verify operation, can include sensing a voltage and/or current change of a bit line coupled to a selected cell in order to determine the state of the selected cell. The sensing operation can involve biasing a bit line, e.g., bit line 107-1, associated with a selected memory cell at a voltage above a bias voltage for a source line, e.g., source line 123, associated with the selected memory cell. A sensing operation could alternatively include precharging the bit line 107-1 followed with discharge when a selected cell begins to conduct, and sensing the discharge.

Sensing the state of a selected cell can include applying one or more sensing voltages, e.g., read voltages "Vread" to a selected word line, while biasing the unselected cells of the string at one or more voltages sufficient to place the unselected cells in a conducting state independent of the threshold voltage of the unselected cells, e.g., pass voltages "Vpass". The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, data stored in the selected cell can be based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2A:
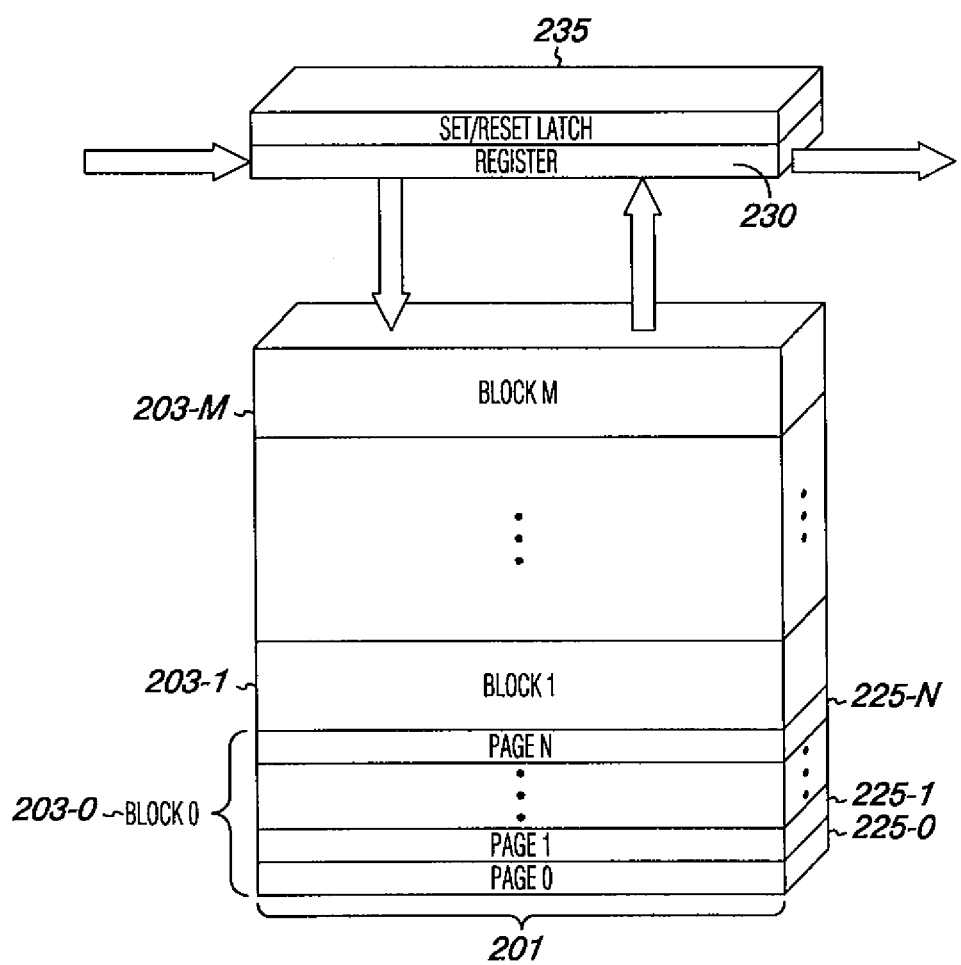
FIG. 2A illustrates a block diagram of a memory architecture in accordance with one or more embodiments of the present disclosure.

FIG. 2A illustrates a block diagram of a memory architecture in accordance with one or more embodiments of the present disclosure. The memory architecture shown in FIG. 2A includes a number of pages, 225-0, 225-1, . . . , 225-N, which together are included in Block 0, 203-0. The memory architecture shown in FIG. 2A includes a number of blocks 203-0, 203-1, . . . , 203-M, which together are included in plane 201.

Each page of memory cells 225-0, 225-1, . . . , 225-N can include a number of memory cells, e.g., non-volatile memory cells 111-1, . . . , 111-N shown in FIG. 1. As used herein, a page of memory cells means a number of memory cells which can store an amount of data programmable at one time. As an example, the amount of data programmable at one time can be referred to as a page of data, and the memory cells which store the page of data can be referred to as a page of memory cells. In one or more embodiments, a page of memory cells can include memory cells coupled to a particular word line, e.g., a word line such as 105-1, ..., 105-N shown in FIG. 1. In one or more embodiments, memory cells coupled to a particular word line can be divided into more than one page, e.g., into an "even" page and "odd" page of data. In one or more embodiments, a page of memory cells can include memory cells coupled to more than one access line.

In one more embodiments, a page of memory cells can have a status associated therewith. The status of a page of memory cells can be based on, e.g., depend on, the state of the memory cells in the page. For example, in one or more embodiments, if all the memory cells in a page are in an erased state, the page has a status of erased. In one or more embodiments, if at least one of the memory cells is programmed to a non-erased state, the page has a status of non-erased.

In one or more embodiments, if more than a substantial majority of the memory cells in a page are in an erased state, the page has a status of erased. In one or more embodiments, if more than a substantial minority of the memory cells are programmed to one or more non-erased states, the page has a status of non-erased. As used herein, the term "substantial majority" means a number which, if met, would lead one of skill in the art to recognize that the status of the page is erased. As used herein, the term "substantial minority" means a number which, if met, would lead one of skill in the art to recognize that the status of the page is non-erased. For example, during an erase operation of a page, a small number of memory cells may not be entirely erased, e.g., may remain non-erased, due to, for example, errors in the memory cells. However, one of skill in the art would still recognize the page as having an erased status, even though not all the memory cells in the page may be in an erased state, e.g., even though at least one of the memory cells in the page may be in a non-erased state.

Each block of memory cells 203-0, 203-1, ..., 203-M can include a number of pages of memory cells, which can form a block of memory cells. For example, as shown in FIG. 2A, block 203-0 includes pages 225-0, 225-1, ..., 225-N. As used herein, a block of memory cells means a number of memory cells which can store an amount of data erasable at one time. For example, the amount of data erasable at one time can be referred to as a block of data, and the memory cells which store the block of data can be referred to as a block of memory cells.

Plane 201 can include a number of blocks, e.g., 203-0, 203-1, ..., 203-M, on a given die. In one or more embodiments, a memory device can include multiple planes per die. For example, in one or more embodiments, a die can include a plane of even numbered blocks and a plane of odd numbered blocks.

As an example, a 2 GB memory device can include 2112 bytes of data per page, 64 pages per block, and 2048 blocks per plane. SLC devices store one bit per cell. MLC devices can store multiple bits per cell, e.g., 2 bits per cell. In a binary system, a "bit" represents one unit of data. As embodiments are not limited to a binary system, the smallest data element may be referred to herein as a "unit."

The memory architecture illustrated in FIG. 2A also includes register 230. As shown in FIG. 2A, plane 201 is in bidirectional communication with register 230. Register 230 can also receive data from input/output (I/O) circuitry, e.g., I/O circuitry 760 shown in FIG. 7, and can communicate data to I/O circuitry.

As one of ordinary skill in the art will appreciate, during a programming operation, data can be loaded from I/O circuitry into register 230, and can then be transferred from register 230 to memory plane 201. This process can repeat until the programming operation completes. During a sensing operation, data can be transferred from memory plane 201 to register 230.

Register 230 can communicate data with I/O circuitry through a number of data cycles. By way of example, a page of data, e.g., 2 kilobytes (kB) of data, can be loaded into register 230 through a number of 1 byte data cycles. Embodiments are not limited to memory devices including a 2 kB page size. Other page sizes can be used with embodiments of the present disclosure, e.g., 4 kB, 8 kB, etc. As the reader will appreciate, a partial page of data can be communicated to and/or from register 230.

In one or more embodiments, register 230 can include circuitry configured to determine a status, e.g., erased and/or non-erased, of a page of memory cells, e.g., pages 225-0, 225-1, ..., 225-N. In one or more embodiments, a state, e.g., erased and/or non-erased, of one or more of the memory cells in a page of memory cells can be sensed, the sensed state(s) can be input into the circuitry, and the circuitry can determine the status of the page based on the inputted sensed state(s). For example, the circuitry can determine whether the status of the page is a particular status, e.g., erased and/or non-erased, based on the inputted sensed state(s). In one or more embodiments, the circuitry can include logic circuitry, as will be further described herein. In one or more embodiments, the circuitry can be configured to determine the number of times a particular state, e.g., erased and/or non-erased, is sensed, and determine the status of the page by determining whether the number of times the particular state is sensed meets a threshold setting, e.g., a substantial majority and/or substantial minority of the number of memory cells in the page. For example, the circuitry can include a counter configured to count the number of times a particular state is sensed, and determine the status of the page by determining whether the number of times the particular state is sensed meets a threshold setting.

Using circuitry located in register 230 to determine a status of one or more pages of memory cells in accordance with one or more embodiments of the present disclosure can be useful in determining whether the one or more pages have been previously programmed, e.g., whether the one or more pages need to be programmed. For example, when a programming operation is initiated, determining a status of one or more pages of memory cells in accordance with one or more embodiments of the present disclosure can indicate whether the one or more pages are to be programmed during the programming operation, e.g., whether the one or more pages have been previously programmed. Further, if a programming operation is interrupted, e.g., if the memory device is powered down abruptly during a programming operation, determining a status of one or more pages in the memory device in accordance with one or more embodiments of the present disclosure can indicate on which page the programming operation is to resume, e.g., which pages were programmed before the interruption and which were not.

In one or more embodiments, after the circuitry located in registry 230 determines the status of a page of memory cells, the status can be output from the register. In one or more embodiments, the status can be output through I/O circuitry.

Figure 7:
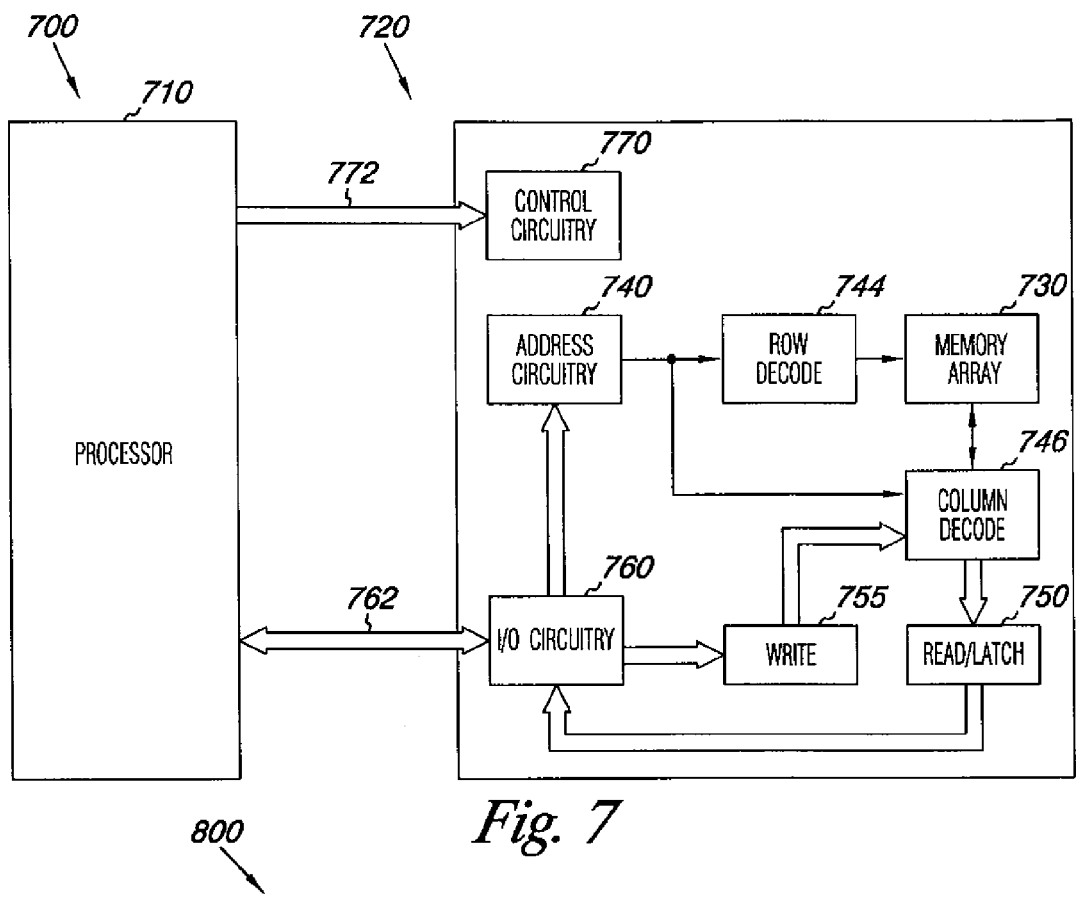
FIG. 7 is a functional block diagram of an electronic memory system having at least one memory device operated in accordance with one or more embodiments of the present disclosure.

For example, in one or more embodiments, the status can be output from register 230 to I/O circuitry, e.g., I/O circuitry 760 shown in FIG. 7.

In one or more embodiments, a status of a page of memory cells can be determined exclusively by the circuitry located in register 230. For example, in such embodiments, the I/O circuitry does not determine the status, rather, the I/O circuitry merely receives the determined status from register 230. Additionally, in one or more embodiments, a sensed state(s) of the memory cells in the page are not output from the register. For example, in such embodiments, the sensed state(s) are not output to the I/O circuitry.

Using circuitry located in register 230 to determine a status of a page of memory cells in accordance with one or more embodiments of the present disclosure can reduce the amount of time used to determine the page status, because using circuitry located, for example, in register 230 to determine the status can eliminate operations that output the sensed state(s) of the memory cells in the page from register 230, e.g., from register 230 to the I/O circuitry, according to some previous approaches. For example, in one or more embodiments, the amount of time used to determine a status of a page of memory cells using circuitry located in register 230 in accordance with one or more embodiments of the present disclosure can be approximately equal to the amount of time used to sense the state(s) of the memory cells in the page. In contrast, the amount of time used to determine the status by outputting the sensed state(s) from register 230 to the I/O circuitry is the sum of the time used to sense the state(s) of the memory cells in the page and the time used to output the sensed state(s) from register 230 to the I/O circuitry. For example, for a page size of 4096 bytes, a sensing operation can take approximately 20 microseconds, and approximately 25 additional nanoseconds are used to output each sensed state for each transfer cycle, e.g., for each output of data from data register 230 to the I/O circuitry. Hence, for a page size of 4096 bytes, the amount of time used to determine the page status using circuitry located in register 230 in accordance with one or more embodiments of the present disclosure can be approximately 20 microseconds, while the amount of time used to determine the page status by outputting the sensed state(s) from register 230 to the I/O circuitry is approximately 122 microseconds.

Further, using circuitry located in register 230 to determine a status of a page of memory cells in accordance with one or more of embodiments of the present disclosure can allow for the implementation of error correction codes (EECs) and/or encryption algorithms that involve scrambling the data stored by the page. For example, if the I/O circuitry is used to determine the page status in accordance with some previous approaches, an EEC and/or encryption algorithm that involves data scrambling that is applied to a page of memory cells will return an error message if either the page status is erased or the page status is non-erased and contain erroneous data. Because an error status is returned in both cases, it is impossible to determine whether the page status is erased or whether the page status is non-erased and the page contains erroneous data. In contrast, if circuitry located in register 230 is used to determine the page status in accordance with one or more embodiments of the present disclosure, an error may be returned if the EEC and/or encryption algorithm is applied to a non-erased page having erroneous data. However, an error may not be returned if the page status is erased.

The memory architecture illustrated in FIG. 2A also includes set/reset latch 235. As shown in FIG. 2A, register 230 is coupled to set/reset latch 235. In one or more embodiments, set/reset latch 235 can include a number of known values, such as known current and/or known voltage values corresponding to an erased, e.g., 1, and/or programmed, e.g., 0, state.

In one or more embodiments, circuitry located in register 230 can be configured to determine a state, e.g., erased and/or non-erased, of a number of memory cells in a page of memory cells, e.g., page 225-0, 225-1, . . . , 225-N, by comparing data in the register that is associated with the memory cells, e.g., current and/or voltage values corresponding to the state of the memory cells, with the number of known values in set/reset latch 235. In one or more embodiments, the data associated with the memory cells and/or the state(s) of the number of memory cells can be determined as part of a sensing operation, as described herein. In one or more embodiments, the sensed state(s) can be used to determine the status of the page, as described herein.

Figure 2B:
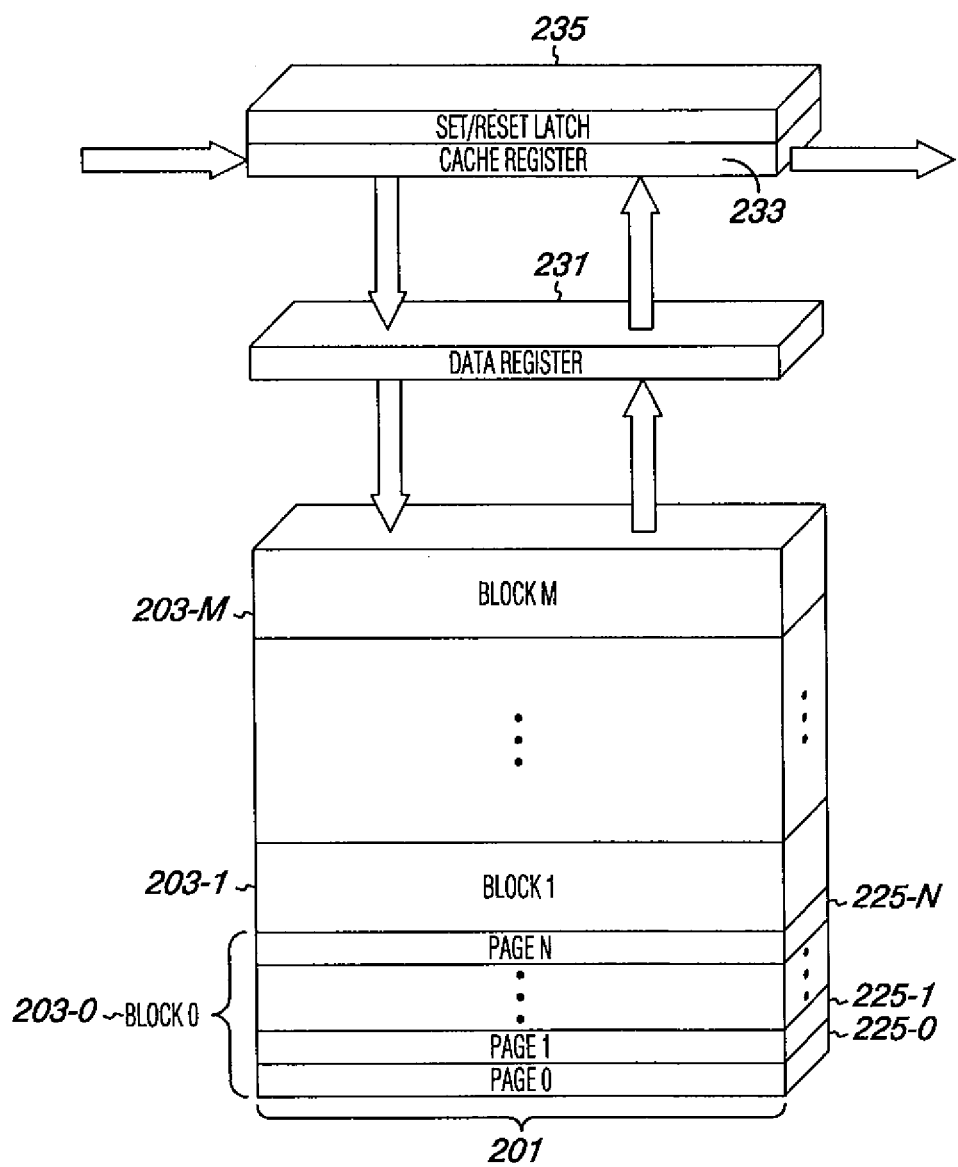
FIG. 2B illustrates a block diagram of a memory architecture in accordance with one or more embodiments of the present disclosure.

FIG. 2B illustrates a block diagram of a memory architecture in accordance with one or more embodiments of the present disclosure. Analogous to FIG. 2A, the memory architecture shown in FIG. 2B includes a number of pages, e.g., 225-0, 225-1, . . . , 225-N, and blocks, e.g., 203-0-203-1, . . . , 203-M in plane 201. However, unlike FIG. 2A, the memory architecture shown in FIG. 2B includes two registers, data register 231 and cache register 233. Data register 231 can operate in an analogous fashion to register 230 in FIG. 2A in that it can transfer data to and receive data from memory plane 201. Cache register 233 can operate in an analogous fashion to register 230 in FIG. 2A in that it can receive data from and communicate data to I/O circuitry through a number of data cycles.

During non-cache operations, the data register 231 and cache register 233 can operate together as a single register, e.g., as register 230 in FIG. 2A. During cache operations, data register 231 and cache register 233 can operate separately in a pipelined process. For example, during a program operation, data from I/O circuitry, e.g., from a host (for instance, from a processor associated with the host), can be loaded into the cache register, e.g., through a number of serially clocked data cycles, and then transferred from the cache register to the data register. After data is transferred to the data register, the contents of the data register can be programmed into memory plane 201. In an example sense operation, data can be sensed from memory plane 201 and loaded into data register 233. After data is loaded into data register 231, it can be transferred to cache register 233. After data has been loaded into cache register 233, it can be transferred out to I/O circuitry.

Using a cache register for sensing operations can allow pipelining a next sequential access from the array while outputting previously-accessed data. Such a double-buffered technique can allow read access time, e.g., $t_R$ shown in FIG. 6, to be "hidden." Data can be first transferred from a memory array to the data register. If the cache register is available, e.g., not busy, the data can be moved from the data register to the cache register. Once the data is transferred to the cache register, the data register is available and can start to load the next sequential page from the memory array.

Using a cache register for programming operations can provide a performance improvement versus non-cached programming operations. Such a double-buffered technique can allow a controller to input data directly to the cache register and use the data register as a holding register to supply data for programming to the array. Such a method can free the cache register so that a next page operation can be loaded in parallel. In some applications, the programming time can be completely "hidden." The data register can maintain data through the programming cycle. Such a method can free up the cache register so that it can start receiving the next page of data from the controller.

In one or more embodiments, data register 231 and/or cache register 233 can include circuitry analogous to the circuitry that can be included in register 230 in FIG. 2A, e.g., circuitry configured to determine a status of a page of memory cells, as described herein. In one or more embodiments, cache register 233 can output the determined status, e.g., output the determined status to I/O circuitry, e.g., I/O circuitry 760 shown in FIG. 7. In one or more embodiments, the status can be determined exclusively by the circuitry in data register 231 and/or cache register 233, which can reduce the amount of time used to determine page status and/or allow for the implementation of error correction codes and/or encryption algorithms which involve data scrambling, as described herein.

The memory architecture shown in FIG. 2B includes set/reset latch 235, which is analogous to set/reset latch 235 shown in FIG. 2A. As shown in FIG. 2B, set/reset latch 235 is coupled to cache register 233. In one or more embodiments, circuitry located in data register 231 and/or cache register 233 can be configured to determine a state of a number of memory cells in a page of memory cells by comparing data in the register that is associated with the memory cells with the known values in set/reset latch 235, as described herein.

Figure 3:
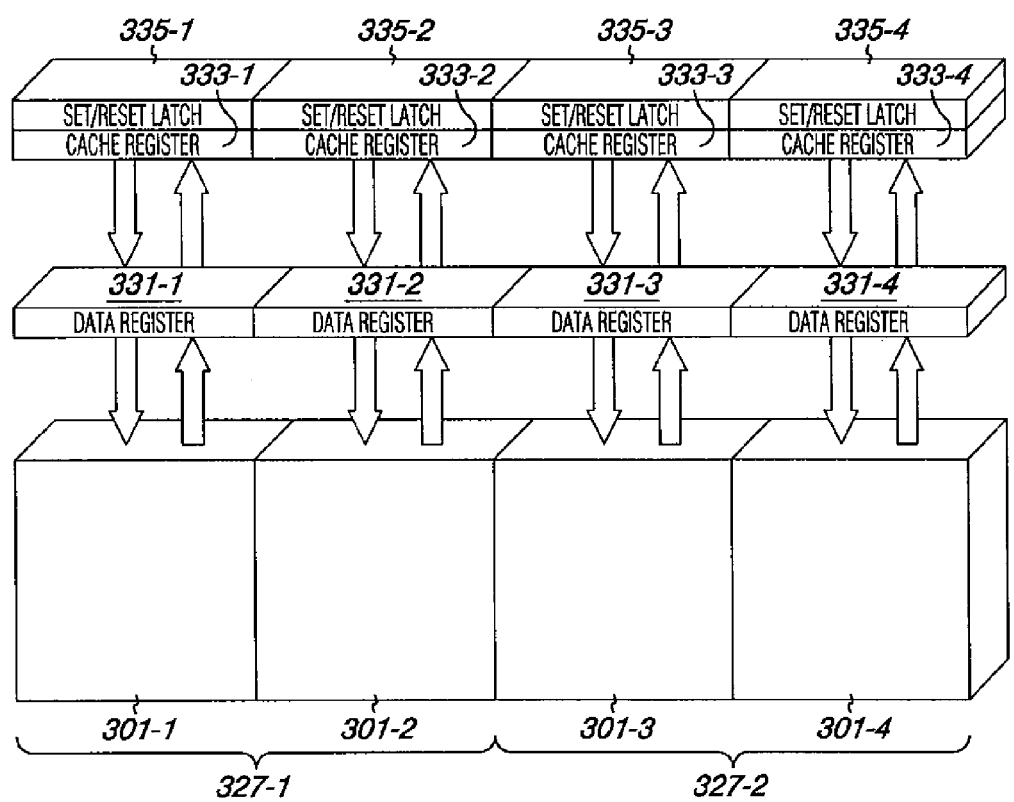
FIG. 3 illustrates a block diagram of a memory architecture in accordance with one or more embodiments of the present disclosure.

FIG. 3 illustrates a block diagram of a memory architecture in accordance with one or more embodiments of the present disclosure. The memory architecture shown in FIG. 3 includes two memory dice 327-1 and 327-2 with two planes each, 301-1, 301-2, 301-3, and 301-4. Each plane is in bidirectional communication with a data register 331-1, 331-2, 331-3, and 331-4 respectively. Each data register is in bidirectional communication with a cache register 333-1, 333-2, 333-3, and 333-4 respectively. Each cache register is coupled to a set/reset latch 335-1, 335-2, 335-3, and 335-4, respectively. Each register and set/reset latch can function substantially as described herein.

In the embodiment illustrated in FIG. 3, plane 301-1 can represent half of the blocks on die 327-1, while plane 301-2 can represent the other half. Plane 301-3 can represent half of the blocks on die 327-2, while plane 301-4 can represent the other half. In one or more embodiments, planes can be divided between odd and even numbered blocks. In one or more embodiments, an "odd" or "even" block of data can be a logical representation of data where data units from half (the "odd" numbered) of the memory cells coupled to access lines associated with the block are stored in an "odd" block and data units from the other half (the "even" numbered) of the memory cells coupled to access lines associated with the block are stored in an "even" block. Embodiments are not limited to a particular plane representing half of the blocks on a given die having more than one plane; other distributions of blocks between planes are possible. Nor are embodiments are not limited to memory devices with a particular number of blocks, planes, or dice.

Figure 4:
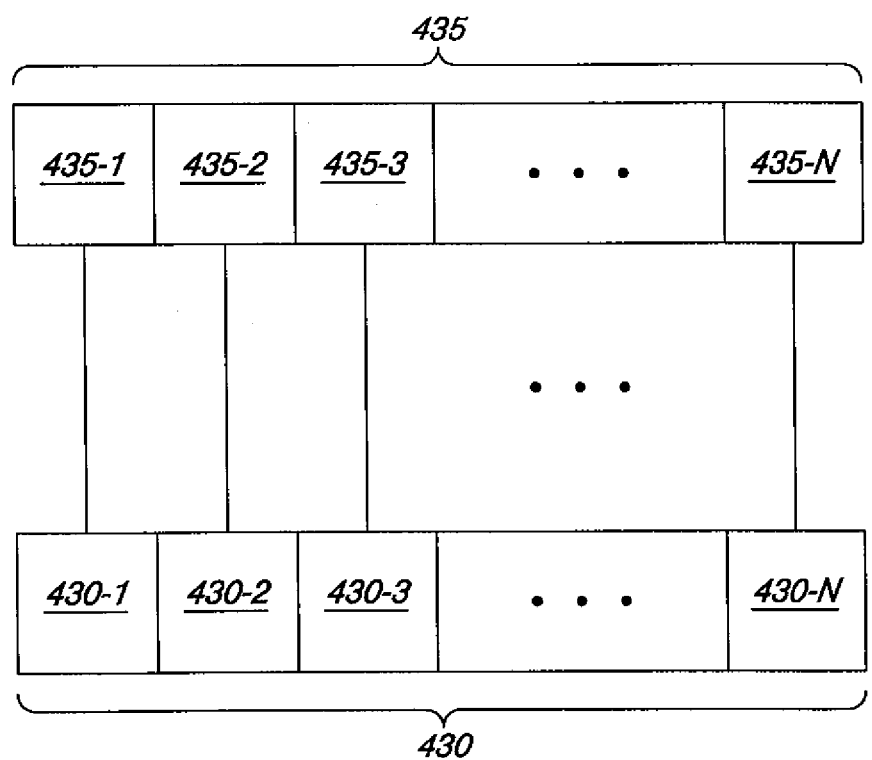
FIG. 4 illustrates a block diagram of a memory architecture in accordance with one or more embodiments of the present disclosure.

FIG. 4 illustrates a block diagram of a memory architecture in accordance with one or more embodiments of the present disclosure. The memory architecture shown in FIG. 4 includes register 430 and set/reset latch 435. In one or more embodiments, register 430 and/or set/reset latch 435 can be analogous to, for example, register 230 and/or set/reset latch 235 shown in FIG. 2A.

As shown in FIG. 4, register 430 can include a number of individual registers 430-1, 430-2, 430-3, . . . , 430-N, and set/reset latch 435 can include a number of individual set/reset latches 435-1, 435-2, 435-3, . . . , 435-N. In one or more embodiments, each individual register can be coupled to a different latch. For example, as shown in FIG. 4, individual register 430-1 is coupled to individual set/reset latch 435-1, individual register 430-2 is coupled to individual set/reset latch 435-2, individual register 430-3 is coupled to individual set/reset latch 435-3, and individual register 430-N is coupled to individual set/reset latch 435-N.

In one or more embodiments, each individual register 430-1, 430-2, 430-3, . . . , 430-N can include data associated with a memory cell, e.g., current and/or voltage values corresponding to the state of a memory cell, in a page of memory cells, e.g., page 225-0, 225-1, . . . , 225-N shown in FIG. 2A. The data in each individual register can be obtained by a sensing operation, as described herein. In one or more embodiments, each individual latch 435-1, 435-2, 435-3, . . . , 435-N can include a known value, e.g., a known voltage and/or current value corresponding to an erased, e.g., 1, and/or programmed, e.g., 0, state.

In one or more embodiments, register 430 can be configured to determine a state, e.g., erased and/or non-erased, of each memory cell in a page of memory cells, e.g., page 225-0, 225-1, . . . , 225-N, by comparing the data in each individual register 430-1, 430-2, 430-3, . . . , 430-N with the known value in the individual latch 435-1, 435-2, 435-3, . . . , 435-N to which each individual register is coupled. For example, register 430 can be configured to determine a state of each memory cell in a page of memory cells by comparing the data in individual register 430-1 with the known value in individual latch 435-1, comparing the data in individual register 430-2 with the known value in individual latch 435-2, comparing the data in individual register 430-3 with the known value in individual latch 435-3, and comparing the data in individual register 430-N with the known value in individual latch 435-N.

In one or more embodiments, the determined state of each memory cell can be used to determine the status of the page, as described herein. For example, if each memory cell is determined to be in an erased state, the page can be determined to have a status of erased. In one or more embodiments, if at least one of the memory cells is determined to be in a non-erased state, the page can be determined to have a status of non-erased. In one or more embodiments, if more than a substantial majority of the memory cells are determined to be in an erased state, the page can be determined to have a status of erased. In one or more embodiments, if more than a substantial minority of the memory cells are determined to be in one or more non-erased states, the page can be determined to have a status of non-erased.

Figure 5A:
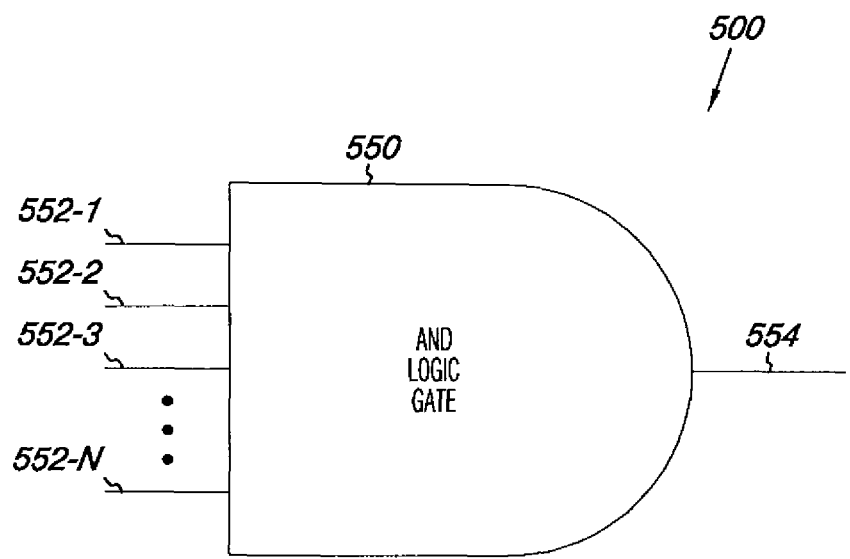
FIG. 5A illustrates logic circuitry for determining a status of a page of memory cells in accordance with one or more embodiments of the present disclosure.

FIG. 5A illustrates logic circuitry 500 for determining a status of a page of memory cells, e.g., page 225-0, 225-1, . . . , 225-N shown in FIG. 2A, in accordance with one or more embodiments of the present disclosure. In one or more embodiments, circuitry 500 can be associated with register 230 shown in FIG. 2A, as described herein.

As shown in FIG. 5A, logic circuitry 500 includes AND logic gate 550. AND logic gate 550 includes inputs 552-1, 552-2, 552-3, . . . , 552-N and output 554. In one or more embodiments, inputs 552-1, 552-2, 552-3, . . . , 552-N can represent data associated with a state of a memory cell in a page of memory cells, e.g., page 225-0, 225-1, . . . , 225-N. For example, input 552-1 can represent data associated with a state of a first memory cell in the page, input 552-2 can represent data associated with a state of a second memory cell in the page, input 552-3 can represent data associated with a state of a third memory cell in the page, and input 552-N can represent data associated with a state of an Nth memory cell in the page.

In one or more embodiments, AND logic gate 550 can determine a status of a page of memory cells whose states(s) are represented by inputs 552-1, 552-2, 552-3, ..., 552-N by performing an AND logic operation on the inputs. For example, AND logic gate 550 can determine if the status of the page is erased or non-erased by performing the AND logic operation on the inputs. The AND logic operation can determine the status of the page by determining whether or not a state of a number of the memory cells in the page is a particular state. For example, the AND logic operation can determine the status of the page by determining whether or not the state of the number of the memory cells in the page is an erased state. If AND logic gate 550 determines that the state of each of the number of memory cells is erased, AND logic gate 550 can determine that the status of the page is erased. Alternatively, if AND logic gate 550 determines that the state of each of the number of memory cells is not erased, AND logic gate 550 can determine that the status of the page is non-erased.

In one or more embodiments, AND logic gate 550 can determine whether a status of a page of memory cells whose state(s) are represented by inputs 552-1, 552-2, 552-3, ..., 552-N is a particular status by performing an AND logic operation on the inputs. For example, AND logic gate 550 can determine whether or not the status of the page of memory cells is an erased status by performing the AND logic operation on the inputs. If each of the number of inputs represent an erased state, AND logic gate 550 can determine that the status of the page is erased by performing the AND logic operation on the inputs. Alternatively, if one or more of the number of inputs represent a non-erased state, AND logic gate 550 can determine that the status of the page is not an erased status by performing the AND logic operation on the inputs.

In one or more embodiments, output 554 can represent the status, e.g., erased or non-erased, determined by AND logic gate 550. In one or more embodiments, output 554 can represent the determination by AND logic gate 550 of whether the status is a particular status. For example, output 554 can represent the determination by AND logic gate 550 of whether or not the status is an erased status. In one or more embodiments, output 554 can be output from register 230, e.g., to I/O circuitry, as described herein.

Figure 5B:
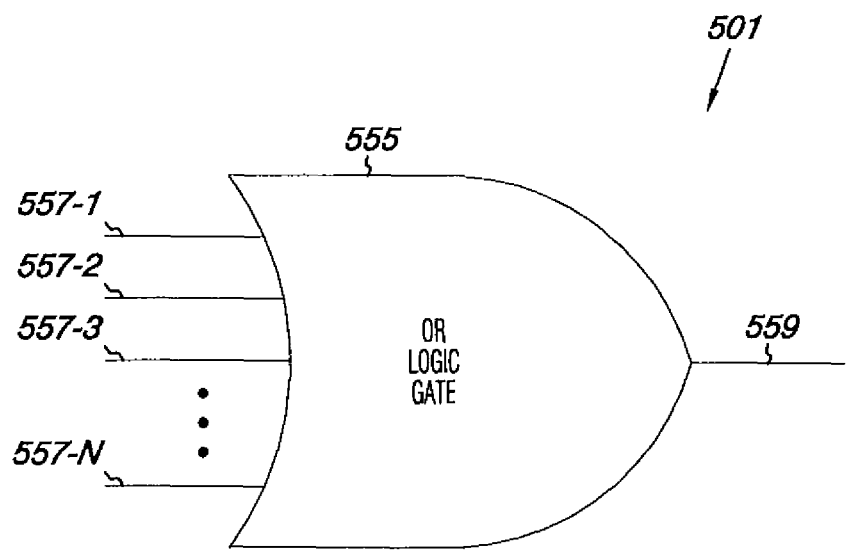
FIG. 5B illustrates logic circuitry for determining a status of a page of memory cells in accordance with one or more embodiments of the present disclosure.

FIG. 5B illustrates logic circuitry 501 for determining a status of a page of memory cells, e.g., page 225-0, 225-1, ..., 225-N shown in FIG. 2A, in accordance with one or more embodiments of the present disclosure. In one or more embodiments, circuitry 501 can be associated with register 230 shown in FIG. 2A, as described herein.

As shown in FIG. 5B, logic circuitry 501 includes OR logic gate 555. OR logic gate 555 includes inputs 557-1, 557-2, 557-3, ..., 557-N and output 559. In one or more embodiments, inputs 557-1, 557-2, 557-3, ..., 557-N can be analogous to inputs 552-1, 552-2, 552-3, ..., 552-N shown in FIG. 5A.

In one or more embodiments, OR logic gate 555 can determine a status of a page of memory cells whose state(s) are represented by inputs 557-1, 557-2, 557-3, ..., 557-N by performing an OR logic operation on the inputs. For example, OR logic gate 555 can determine if the status of the page is erased or non-erased by performing the OR logic operation on the inputs. The OR logic operation can determine the status of the page by determining whether or not a state of at least one of the one or more memory cells in the page is a particular state. For example, the OR logic operation can determine the status of the page by determining whether or not the state of at least one of the one or more memory cells in the page is a non-erased state. If OR logic gate 555 determines that the state of at least one of the one or more memory cells is non-erased, OR logic gate 555 can determine that the status of the page is non-erased. Alternatively, if OR logic gate 555 determines that the state of none of the one or more memory cells is non-erased, OR logic gate 555 can determine that the status of the page is erased.

In one or more embodiments, OR logic gate 555 can determine whether a status of a page of memory cells whose state(s) are represented by inputs 557-1, 557-2, 557-3, ..., 557-N is a particular status by performing an OR logic operation on the inputs. For example, OR logic gate 555 can determine whether or not the status of the page of memory cells is a non-erased status by performing the OR logic operation on the inputs. If at least one of the number of inputs represent a non-erased state, OR logic gate 555 can determine that the status of the page is non-erased by performing the OR logic operation on the inputs. Alternatively, if none of the number of inputs represent a non-erased state, OR logic gate can determine that the status of the page is not a non-erased status by performing the OR logic operation on the inputs.

In one or more embodiments, output 559 can represent the status, e.g., erased or non-erased, determined by OR logic gate 555. In one or more embodiments, output 559 can represent the determination by OR logic gate 555 of whether the status is a particular status. For example, output 559 can represent the determination by OR logic gate 555 of whether or not the status is a non-erased status. In one or more embodiments, output 559 can be output from register 230, e.g., to I/O circuitry, as described herein.

Figure 6:
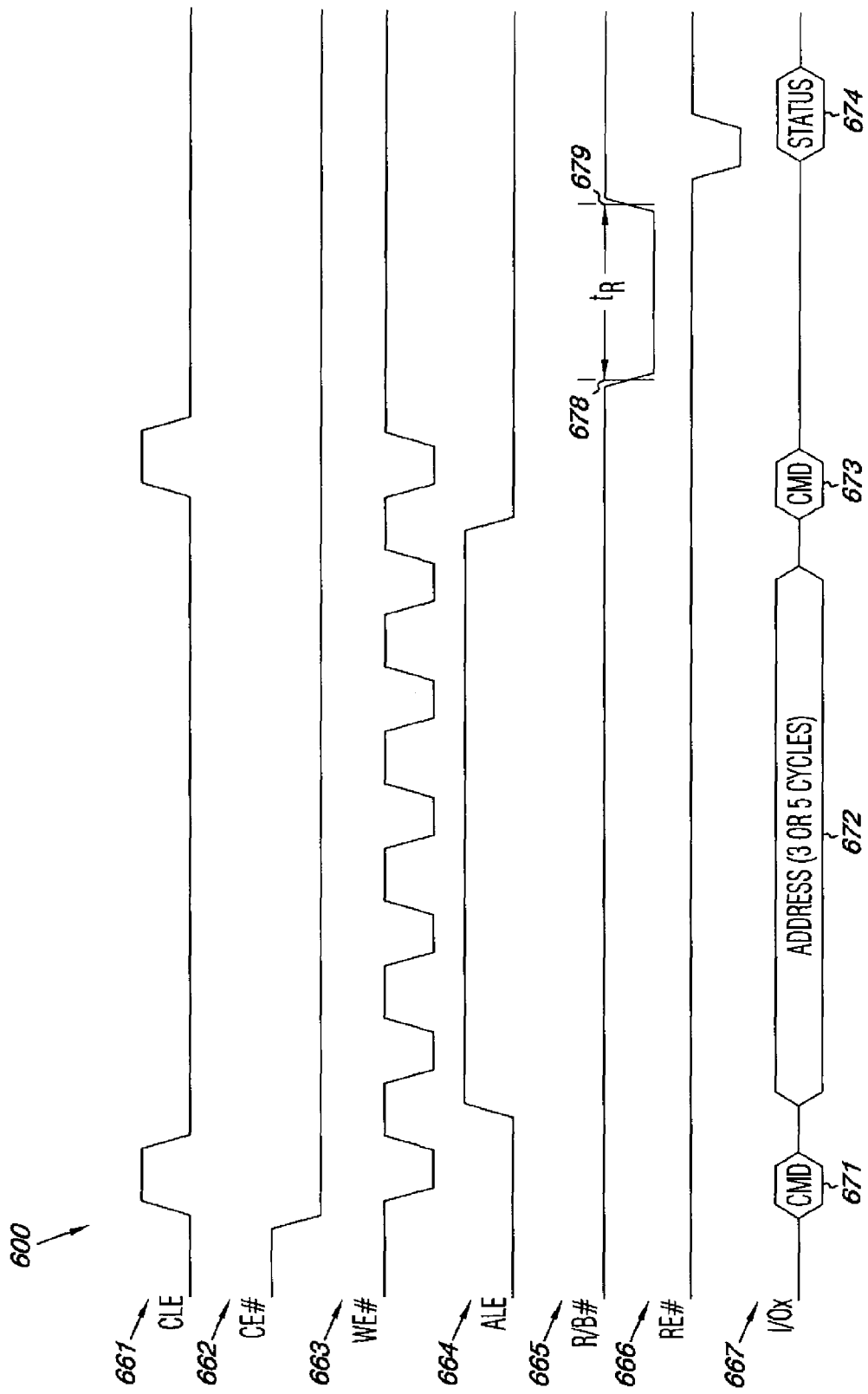
FIG. 6 illustrates a timing diagram of various signals during operation of a memory device in accordance with one or more embodiments of the present disclosure.

FIG. 6 illustrates a timing diagram 600 of various signals during operation of a memory device in accordance with one or more embodiments of the present disclosure. Timing diagram 600 includes command latch enable (CLE) signal 661, chip enable (CE#) signal 662, write enable (WE#) signal 663, address latch enable (ALE) signal 664, ready/busy (R/B#) signal 665, read enable (RE#) signal 666, and input/output (I/Ox) signal 667. The "#" symbol after a signal indicates that the signal is asserted LOW.

WE# signal 663 is responsible for clocking data, address, and/or commands into the memory device. RE# signal 666 enables the output data buffers, and is responsible for outputting data. When CLE signal 661 is HIGH, commands are latched into a command register on the rising edge of the WE# signal 663. When ALE signal 664 is high, addresses are latched into an address register on the rising edge of the WE# signal 663. If CE# signal 662 is not asserted, the memory device remains in standby mode and does not respond to any control signals. If the memory device is busy with an erase, program, and/or sense operation, R/B# signal 665 is asserted LOW. For example, during a sense operation, R/B# signal 665 is low from 678 to 679, e.g., for time $t_R$, as shown in FIG. 6.

Control circuitry, e.g., control circuitry 770 shown in FIG. 7, can initiate memory device operations, e.g., erase, program, and/or sense operations, by issuing a command cycle, such as CMD 671. As shown in FIG. 6, CMD 671 is issued by placing the command on I/Ox signal 667, driving CLE signal 661 HIGH and CE# signal 662 LOW, and issuing a WE#663 signal clock. Commands, addresses, and/or data can be clocked into the memory device on the rising edge of WE# signal 663. For example, in a program operation, the data to be programmed can be clocked into a register, e.g., register 230 shown in FIG. 2A, on the rising edge of WE# signal 663. As shown in FIG. 6, a command can include a number of address cycles, e.g., address cycles 672, and/or a second command cycle, e.g., CMD 673.

As shown in FIG. 6, a status command, e.g., STATUS command 674, can be issued on I/Ox signal 667. STATUS command 674 can initiate a sequence to determine a status of a page of memory cells in accordance with one or more embodiments described herein. For example, STATUS command can initiate a sequence that includes determining a status of a page of memory cells without outputting a sensed state of the memory cells in the page to input/output (I/O) circuitry in response to the status command. STATUS command 674 can also initiate a sequence to determine whether or not a status of a page of memory cells is a particular status, in accordance with one or more embodiments described herein. For example, STATUS command 674 can initiate a sequence that includes programming a threshold setting, sensing a state of a number of memory cells in a page of memory cells, determining a number of times a particular state is sensed, and determining whether a status of the page is a particular status by determining whether the number of times the particular state is sensed meets the threshold setting without outputting the sensed state of the number of memory cells from a register coupled to the page and in communication with I/O circuitry in accordance with one or more embodiments of the present disclosure. As shown in FIG. 6, STATUS command 674 can be issued subsequent to a sense operation, e.g., subsequent to $t_R$. However, embodiments of the present disclosure are not so limited.

FIG. 7 is a functional block diagram of an electronic memory system 700 having at least one memory device 720 operated in accordance with one or more embodiments of the present disclosure. Memory system 700 includes a processor 710 coupled to a non-volatile memory device 720 that includes a memory array 730 of non-volatile cells, e.g., memory array 100 of non-volatile cells 111-1, . . . , 111-N shown in FIG. 1. The memory system 700 can include separate integrated circuits or both the processor 710 and the memory device 720 can be on the same integrated circuit. The processor 710 can be a microprocessor or some other type of controlling circuitry such as an application-specific integrated circuit (ASIC).

The memory device 720 includes an array of non-volatile memory cells 730, which can be floating gate flash memory cells with a NAND architecture, as described herein. The control gates of memory cells of a "row" are coupled with a word line, while the drain regions of the memory cells of a "column" are coupled to bit lines, as described herein. The source regions of the memory cells are coupled to source lines, as described herein. As will be appreciated by those of ordinary skill in the art, the manner of connection of the memory cells to the bit lines and source lines depends on whether the array is a NAND architecture, a NOR architecture, an AND architecture, or some other memory array architecture.

The embodiment of FIG. 7 includes address circuitry 740 to latch address signals provided over I/O connections 762 through I/O circuitry 760. Address signals are received and decoded by a row decoder 744 and a column decoder 746 to access the memory array 730. In light of the present disclosure, it will be appreciated by those skilled in the art that the number of address input connections depends on the density and architecture of the memory array 730 and that the number of addresses increases with both increased numbers of memory cells and increased numbers of memory blocks and arrays.

The memory device 720 senses data in the memory array 730 by sensing voltage and/or current changes in the memory array columns using sense/buffer circuitry that in this embodiment can be read/latch circuitry 750. The read/latch circuitry 750 can read and latch a page, e.g., a row, of data from the memory array 730. I/O circuitry 760 is included for bi-directional data communication over the I/O connections 762 with the processor 710. Write circuitry 755 is included to write data to the memory array 730.

Control circuitry 770 decodes signals provided by control connections 772 from the processor 710. These signals can include chip signals, write enable signals, and address latch signals that are used to control the operations on the memory array 730, including data sensing, data write, and data erase operations, as described herein. In one or more embodiments, the control circuitry 770 is responsible for executing instructions from the processor 710 to perform the operations according to embodiments of the present disclosure. The control circuitry 770 can be a state machine, a sequencer, or some other type of controller. It will be appreciated by those skilled in the art that additional circuitry and control signals can be provided, and that the memory device detail of FIG. 7 has been reduced to facilitate ease of illustration.

Figure 8:
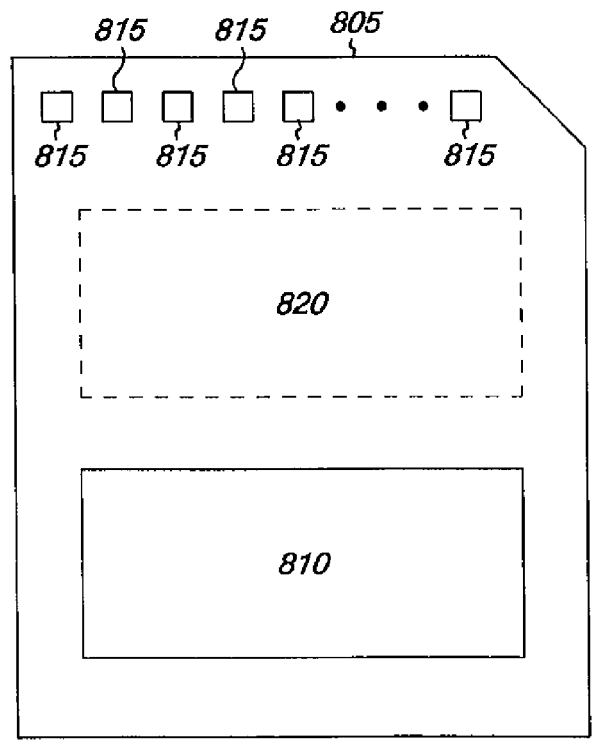
FIG. 8 is a functional block diagram of a memory module having at least one memory device operated in accordance with one or more embodiments of the present disclosure.

FIG. 8 is a functional block diagram of a memory module 800 having at least one memory device operated in accordance with one or more embodiments of the present disclosure. Memory module 800 is illustrated as a memory card, although the concepts discussed with reference to memory module 800 are applicable to other types of removable or portable memory (e.g., USB flash drives and/or solid-state drives) and are intended to be within the scope of "memory module" as used herein. In addition, although one example form factor is depicted in FIG. 8, these concepts are applicable to other form factors as well.

In one or more embodiments, memory module 800 will include a housing 805 (as depicted) to enclose one or more memory devices 810, though such a housing is not essential to all devices or device applications. At least one memory device 810 includes an array of non-volatile multilevel memory cells, e.g., array 100 of non-volatile memory cells 111-1, . . . , 111-N shown in FIG. 1. Where present, the housing 805 includes one or more contacts 815 for communication with a host device. Examples of host devices include digital cameras, digital recording and playback devices, PDAs, personal computers, memory card readers, interface hubs and the like. For one or more embodiments, the contacts 815 are in the form of a standardized interface. For example, with a USB flash drive, the contacts 815 might be in the form of a USB Type-A male connector. For one or more embodiments, the contacts 815 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 815 provide an interface for passing control, address and/or data signals between the memory module 800 and a host having compatible receptors for the contacts 815.

The memory module 800 may optionally include additional circuitry 820, which may be one or more integrated circuits and/or discrete components. For one or more embodiments, the additional circuitry 820 may include control circuitry, such as a memory controller, for controlling access across multiple memory devices 810 and/or for providing a translation layer between an external host and a memory device 810. For example, there may not be a one-to-one correspondence between the number of contacts 815 and a number of connections to the one or more memory devices 810. Thus, a memory controller could selectively couple an I/O connection (not shown in FIG. 8) of a memory device 810 to receive the appropriate signal at the appropriate I/O connection at the appropriate time or to provide the appropriate signal at the appropriate contact 815 at the appropriate time. Similarly, the communication protocol between a host and the memory module 800 may be different than what is used for access of a memory device 810. A memory controller could then translate the command sequences received from a host into the appropriate command sequences to achieve the desired access to the memory device 810. Such translation may further include changes in signal voltage levels in addition to command sequences.

The additional circuitry 820 may further include functionality unrelated to control of a memory device 810 such as logic functions as might be performed by an ASIC. Also, the additional circuitry 820 may include circuitry to restrict read or write access to the memory module 800, such as password protection, biometrics or the like. The additional circuitry 820 may include circuitry to indicate a status of the memory module 800. For example, the additional circuitry 820 may include functionality to determine whether power is being supplied to the memory module 800 and whether the memory module 800 is currently being accessed, and to display an indication of its status, such as a solid light while powered and a flashing light while being accessed. The additional circuitry 820 may further include passive devices, such as decoupling capacitors to help regulate power requirements within the memory module 800.

CONCLUSION

The present disclosure includes methods, devices, modules, and systems for operating semiconductor memory. One method embodiment includes determining a status of a page of memory cells without using input/output (I/O) circuitry, and outputting the status through the I/O circuitry.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   initiating a programming operation of one or more pages of memory cells;
   determining a status of the one or more pages of memory cells exclusively by circuitry located in a register coupled to the one or more pages and without outputting a sensed state of the memory cells in the one or more pages to input/output (I/O) circuitry; and
   determining whether the one or more pages are to be programmed during the programming operation based on the status of the one or more pages.

2. The method of claim 1, wherein determining the status of the one or more pages includes determining the status of the one or more pages subsequent to an interruption in the programming operation.

3. The method of claim 1, including determining on which page the programming operation is to resume based on the status of the one or more pages.

4. The method of claim 1, wherein the method includes outputting the determined status through the I/O circuitry.

5. The method of claim 1, wherein determining the status of the one or more pages includes inputting a representation of a state of each of the number of memory cells in the one or more pages into an AND logic gate.

6. The method of claim 1, wherein determining the status of the one or more pages includes inputting a representation of a state of each of the number of memory cells in the one or more pages into an OR logic gate.

7. A memory device, comprising:
   a page of memory cells;
   control circuitry configured to initiate a programming operation of the page of memory cells; and
   a register coupled to the page of memory cells and configured to:
      determine a status of the page of memory cells using exclusively circuitry located in the register and without outputting a sensed state of the memory cells in the page to input/output (I/O) circuitry; and
      determine whether the page of memory cells is to be programmed during the programming operation based on the status of the page.

8. The memory device of claim 7, wherein the control circuitry is configured to input the sensed state of the memory cells into the circuitry located in the register.

9. The memory device of claim 7, wherein the control circuitry is configured to apply an error correction code to the page of memory cells.

10. The memory device of claim 7, wherein the control circuitry is configured to apply an encryption algorithm to the page of memory cells.

11. A memory device, comprising:
    a page of memory cells;
    control circuitry configured to initiate a programming operation of the page of memory cells;
    input/output (I/O) circuitry; and
    a register coupled to the page of memory cells and configured to:
       determine a status of the page of memory cells using exclusively circuitry located in the register and without outputting a sensed state of the memory cells in the page to the I/O circuitry; and
       determine whether the page of memory cells is to be programmed during the programming operation based on the status of the page.

12. The memory device of claim 11, wherein the register is configured to:
    receive a number of inputs, wherein each input represents a sensed state of a different one of the memory cells in the page; and
    determine the status of the page of memory cells based on the number of inputs.

13. The memory device of claim 11, wherein the register is configured to:
- determine a number of times a particular state of the memory cells in the page is sensed; and
- determine the status of the page of memory cells by determining whether the number of times the particular state is sensed meets a threshold setting.

14. The memory device of claim 13, wherein the control circuitry is configured to program the threshold setting.

15. The memory device of claim 13, wherein:
- the particular state is an erased state; and
- the threshold setting is a number equal to a substantial majority of the memory cells in the page.

16. The memory device of claim 13, wherein:
- the particular state is a non-erased state; and
- the threshold setting is a number equal to a substantial minority of the memory cells in the page.

* * * * *